(12) United States Patent
Matthews et al.

(10) Patent No.: US 7,106,057 B2
(45) Date of Patent: Sep. 12, 2006

(54) HIGH FREQUENCY SCANNING SQUID MICROSCOPE AND METHOD OF MEASURING HIGH FREQUENCY MAGNETIC FIELDS

(75) Inventors: John Matthews, Greenbelt, MD (US); Frederick Charles Wellstood, Fairfax, VA (US); Soun Pil Kwon, Hyattsville, MD (US); Kosta P. Vlahacos, Clarksville, MD (US)

(73) Assignees: University of Maryland, College Park, MD (US); National Security Agency, Fort George Meade, MD (US)

( * ) Notice: Subject to any disclaimer, the term of this patent is extended or adjusted under 35 U.S.C. 154(b) by 10 days.

(21) Appl. No.: 11/081,529

(22) Filed: Mar. 17, 2005

(65) Prior Publication Data

US 2005/0206376 A1    Sep. 22, 2005

Related U.S. Application Data

(60) Provisional application No. 60/553,915, filed on Mar. 17, 2004.

(51) Int. Cl.
*G01R 33/02* (2006.01)
*G01R 33/035* (2006.01)

(52) U.S. Cl. ..................... 324/248; 505/846
(58) Field of Classification Search ............... 324/248; 505/846
See application file for complete search history.

(56) References Cited

U.S. PATENT DOCUMENTS 5,045,788 A * 9/1991 Hayashi et al. ............. 324/248
5,095,270 A * 3/1992 Ludeke ....................... 324/248

* cited by examiner

*Primary Examiner*—Reena Aurora
(74) *Attorney, Agent, or Firm*—Rosenberg, Klein & Lee

(57) ABSTRACT

A scanning SQUID microscope capable of high frequency magnetic field measurements uses a hysteretic SQUID detector and a pulsed sampling technique which permits to extend the bandwidth of the SQUID microscope to above GHz region. The system can be readily incorporated into a 4.2k scanning SQUID microscope for imaging chips at room temperature. By biasing the hysteretic SQUID with pulses of a predetermined amplitude, and adjusting a modulation flux applied to the hysteretic SQUID at a plurality of time delays between the activation of the sample under study and the bias pulse, the hysteretic SQUID can be switched on, and the modulation flux value corresponding to such a switching event as a function of time is considered as representation of the magnetic field emanating from the sample under study.

17 Claims, 9 Drawing Sheets

PULSED SQUID SAMPLING
REACTION TO SMALL AMPLITUDE PULSES

PULSED SQUID SAMPLING
REACTION TO LARGE AMPLITUDE PULSES

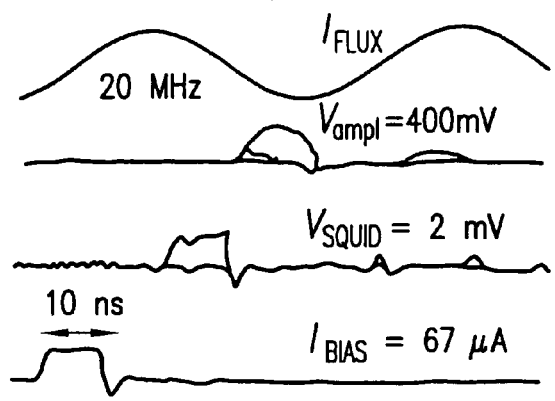
FIG. 7
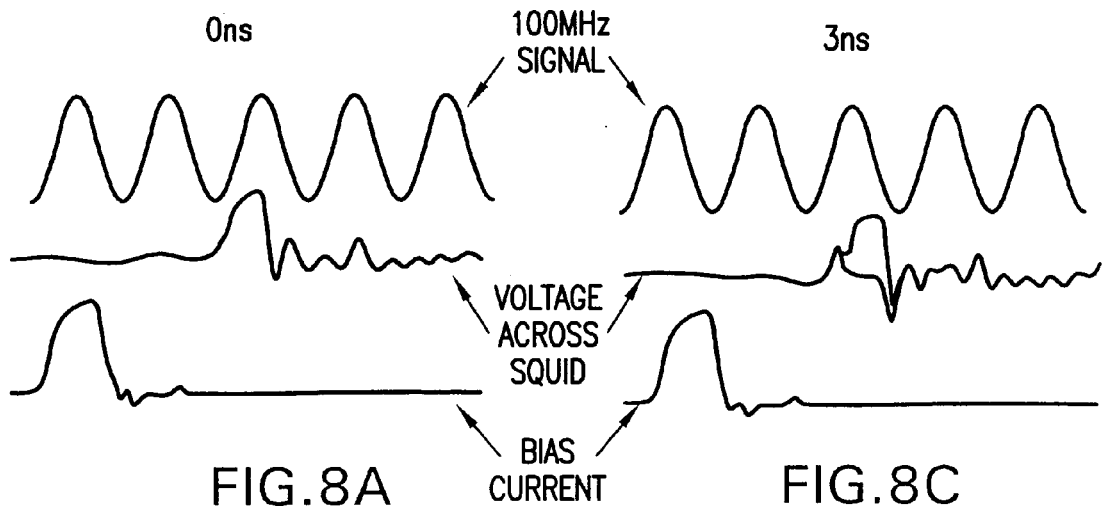
FIG. 8A
FIG. 8C
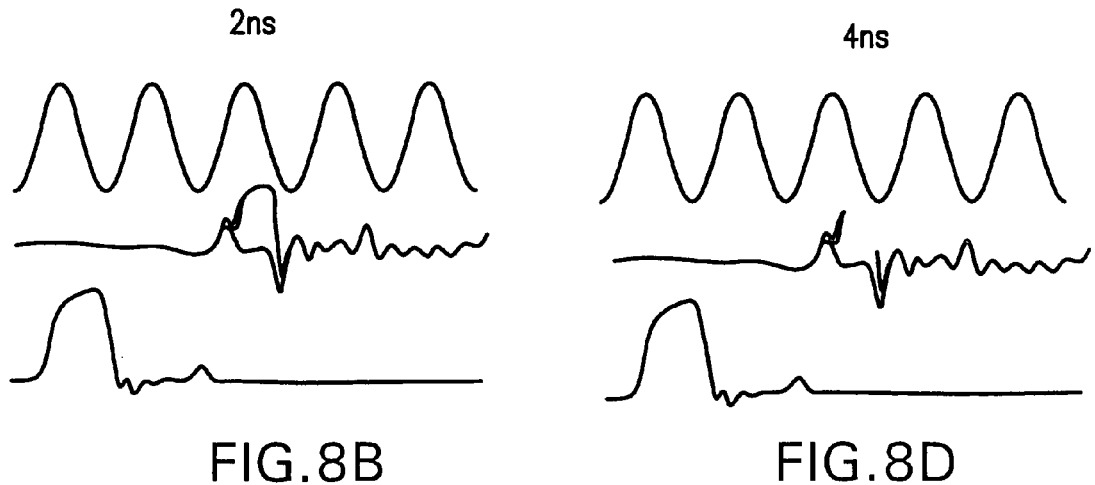
FIG. 8B
FIG. 8D

HIGH FREQUENCY SCANNING SQUID MICROSCOPE AND METHOD OF MEASURING HIGH FREQUENCY MAGNETIC FIELDS

REFERENCE TO RELATED APPLICATIONS

This Utility Patent Application is based on Provisional Patent Application Ser. No. 60/553,915, filed 17 Mar. 2004.

FIELD OF THE INVENTION

The present invention relates to magnetic microscopy; and in particular, for magnetically obtaining images of electrical currents flowing in microelectronic structures by means of scanning SQUID microscopes.

More in particular, the present invention relates to high frequency scanning SQUID microscopes with a bandwidth extended into the GHz range. The high frequency scanning of magnetic fields is conducted with pulsed sampling of the magnetic field with a hysteretic SQUID.

The present invention further relates to high frequency measurements of magnetic fields emanating from an object under study, particularly, for obtaining the images of electrical currents flowing in microelectronic structures for non-destructive evaluation of the structures and location of possible defects. Specifically, the method of high frequency (in the range of GHz and above) measurement of magnetic field employs pulsed sampling of the magnetic field emanating from the sample under study. In this method, a pulsed bias current $I_{bias}$ with the pulses of a predetermined amplitude are applied to a SQUID at a plurality of time delays regarding the activation of the sample under study. Additional DC modulation flux is applied to the hysteretic SQUID. The modulation flux is swept over the predetermined flux range to cause the switching event of the hysteretic SQUID. As the result of the pulsed sampling technique, a histogram is obtained of modulation flux values causing a switching event of the hysteretic SQUID as a function of time. This modulation flux is related to the magnetic field at a particular time and a particular location related to the sample under study. By applying a standard magnetic inverse to the magnetic field, an image of electrical currents flowing in the sample under study may be obtained for non-destructive evaluation thereof.

BACKGROUND OF THE INVENTION

In scanning SQUID microscopes, the output from a small Superconducting Quantum Interference Device (SQUID) is recorded as a sample is moved relative to the SQUID. The SQUID acts as the approximately point-like near field detector of the magnetic field, and the resulting data is used to construct an image of magnetic fields from the sample. The image of magnetic fields is further converted into the images of currents flowing in the sample under study by standard magnetical inverse.

The SQUID consists of two superconductors separated by thin insulating layers to form two parallel Josephson junctions. The device may be configured as a magnetometer to detect extremely small magnetic fields—small enough to measure the magnetic fields of living organisms.

The great sensitivity of the SQUID devices is associated with measuring changes in magnetic fields associated with one flux quantum. One of the discoveries associated with Josephson junction was that flux is quantized in units $$\Phi_0 = \frac{2\pi h}{2e} \cong 2.0678 \times 10^{-15} tesla \cdot m^2 \quad (1)$$

If a constant biasing current is maintained in the SQUID device, the measured voltage oscillates with the changes in phase at the two junctions, which depends upon the change in the magnetic flux. Counting the oscillations permits evaluation of the flux change which has occurred.

One of the main commercial applications of SQUID microscopes is fault detection of importance in the semiconductor industry. Images of the source currents can be generated by applying a magnetic inverse technique to the magnetic field images. Disadvantageously, with the present technology, the bandwidth of SQUID microscopes has not exceeded a few MHz. This is not an inherent limitation of the SQUID itself, whose bandwidth is many order of magnitude higher but rather of the electronics used to monitor the SQUID.

The present SQUID electronics consists of a feedback loop which maintains the magnetic flux through the SQUID loop constant. The electronics is based around an internal oscillator which operates typically at 100–300 KHz. The closed loop gain actually drops off somewhat lower than this value. Since the present invention of computer processors operate at over a GHz, well above the bandwidth of the present SQUID microscopes, the fault detection in the semiconductor industry with the present SQUID microscopes is somewhat limited for traditional scanning SQUID microscopes.

With the advance of semiconductor processor clock speed in excess of a GHz, the ability to image over a much larger bandwidth is desirable.

Therefore, the scanning SQUID microscopes with extended bandwidths to and above a GHz region is desirable and needed in magnetic microscopy.

SUMMARY OF THE INVENTION

It is therefore an object of the present invention to provide a high frequency scanning SQUID microscope capable of measuring magnetic fields in the range in excess of a GHz.

It is another object of the present invention to provide a measurement method permitting an extension of the bandwidth of scanning SQUID microscopes to a range exceeding GHz range.

It is a further object of the present invention to provide a measuring technique in which a hysteretic SQUID is used in the measurement scheme to sample magnetic fields emanating from the sample under study and where a pulsed sampling technique is employed.

It is an object of the present invention to extend the bandwidth of SQUID measurements by biasing the hysteretic SQUID with a pulsed bias current having the amplitude of pulses preset within the critical current range of the hysteretic SQUID, and by initiating the switching event of the hysteretic SQUID with an additional DC modulating flux applied to the SQUID. The value of the modulating flux sufficient to cause the triggering event of the hysteretic SQUID at a predetermined time point serves as a measure of the measured magnetic field.

It is still a further object of the present invention to provide a technique for extending the bandwidth of the scanning SQUID microscope wherein the hysteretic SQUID is pulse biased and the count of switching events occurring in the hysteretic SQUID are monitored as a function of time and monitoring flux applied to the hysteretic SQUID.

In one aspect of the present invention there is provided a method of high frequency measurement of magnetic fields with a Superconducting Quantum Interference Device (SQUID) which includes the steps of:
positioning a hysteretic SQUID over a predetermined location in proximity to a sample under study,
activating, at a predetermined time point, the sample under study to generate magnetic fields emanating therefrom, and
pulse sampling the magnetic field by:
applying, with a predetermined time delay from said predetermined time point, a pulsed bias current to the hysteretic SQUID,
coupling a modulation flux to the SQUID, and sweeping the modulation flux over a predetermined flux range sufficient to trigger the SQUID, thus resulting in generation of at least one SQUID switching event at a respective modulation flux value. Sampling the magnetic fields is then repeated for a plurality of time delays.

The modulation flux value at which the switching event in the hysteretic SQUID has been obtained serves as the measure of magnetic field emanating from the sample under study. Since such sampling is performed at different time delays, the map of modulation flux values causing the switching events in the SQUID may be obtained and interpolated into the magnetic fields as a function of time.

The hysteretic SQUID has a critical current range and the amplitude of the pulses in the pulsed bias current is preset to be substantially at the midpoint of the critical current range.

In order to obtain the map of the modulation flux values, a processor (which is an inherent component of the scanning SQUID microscope) generates a two-dimensional histogram of the recorded switching event as a function of the modulation flux values causing the switching events in the hysteretic SQUID and the time delays.

Further for each value of the time delay, the processor interpolates the respective modulation flux values which results in a map of a magnetic flux emanating from the sample under study as a function of time.

Upon the pulsed sampling of the magnetic field having been performed at a predetermined location of the two-dimensional area on the sample under study, the SQUID is displaced to another location within the boundaries of the two-dimensional area and the pulsed sampling of the magnetic field is repeated in the identified fashion.

The present invention also represents a high frequency scanning Superconducting Quantum Interference Device (SQUID) microscope which comprises:
a hysteretic SQUID sensor,
a scanning unit operatively coupled to the hysteretic SQUID sensor to change a relative disposition between the latter and an object under study,
a power source coupled to the object under study to activate the hysteretic SQUID sensor at a predetermined time in order to generate a magnetic field emanating therefrom, and
a pulsed sampling unit.
The pulsed sampling unit includes:
a pulse generator coupled to the hysteretic SQUID sensor to supply a pulsed bias current consisting of pulses of a predetermined amplitude,
a clock circuit coupled to the pulse generator to apply the bias current pulse to the hysteretic SQUID sensor with a predetermined time delay relative to the predetermined time of the sample activation, and
a flux modulation unit magnetically coupled to the hysteretic SQUID sensor to feed a magnetic modulation flux in a predetermined value range sufficient to cause at least one switching event in the hysteretic SQUID.

The SQUID microscope further includes a counter for acquiring and recording switching events of the hysteretic SQUID sensor, and
a processor for interpolating the respective modulation flux values at which the switching events at the hysteretic SQUID occur in order to obtain a corresponding value of the magnetic field emanating from the sample under study.

These and other novel features and advantages of this invention will be fully understood from the following detailed description of the accompanying Drawings.

BRIEF DESCRIPTION OF THE DRAWINGS

FIG. 7 is an oscilloscope trace showing (from bottom to top) a $10^{ns}$ bias current pulse, SQUID voltage response, amplified SQUID voltage, and a test signal of the experimental set-up of FIG. 4;

FIGS. 8A, 8B, 8C, and 8D are representations of the oscilloscope tray surfaces showing switching of hysteretic SQUID to 100 MHz magnetic field at different time delays (0 ns, 2 ns, 3 ns, and 4 ns time delay, respectively (the oscillogram traces are shown to include—from the bottom to the top—bias current, voltage across the SQUID, and 100 MHz test signal);

DETAILED DESCRIPTION OF THE PREFERRED EMBODIMENTS

Figure 1A:
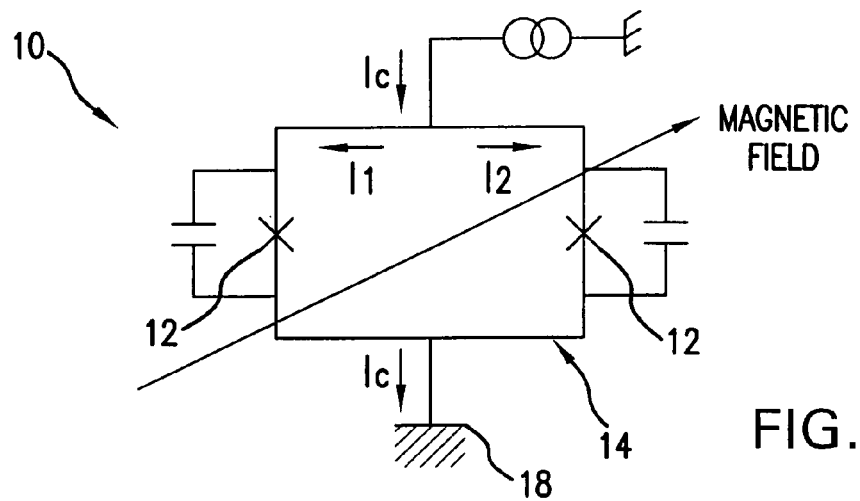
FIG. 1A is a schematic representation of a hysteretic SQUID having a pair of capacitively shunted Josephson Junctions.

Referring to FIG. 1A, a hysteretic SQUID 10 is shown including a pair of capacitively shunted Josephson junctions 12. The SQUID device, being used as a magnetometer, is based on the interaction between the magnetic flux and the Josephson junction(s). The magnetic flux modulates the current passing through the junction, which is detected and amplified by feedback electronics. The main part of the SQUID 10 is the dual junction superconducting loop (SQUID loop) 14 carrying a critical supercurrent Ic. In FIG. 1A, the currents $I_1$ and $I_2$ are the junction currents with each passing through a respective junction 12. The critical supercurrent flows in the SQUID loop 14 as long as a source 16 and a sink (or ground) 18 are connected thereto. The critical super-current Ic is a maximum current that loop 14 will carry without developing a potential difference. The interference effect used in the SQUID 10 is the modulation of the super-current by an applied magnetic field passing through the loop 14. This occurs due to the fact that the magnetic field changes the phases of the wave functions across the junctions 12 and thus, the currents through them.

The I–V diagram of the hysteretic SQUID shows that prior to the current flowing through the junctions reaching a critical value Ic ($\Phi$), the hysteretic SQUID is not switched on. If $I_{bias}$<Ic, no transition occurs and the SQUID remains at $V_{SQUID}$=0. However, if $I_{bias}$>Ic, the transition occurs so that the output voltage of the SQUID $V_{SQUID}$≠0. The output voltage of the SQUID serves as an indication of the switching event.

Figure 1B:
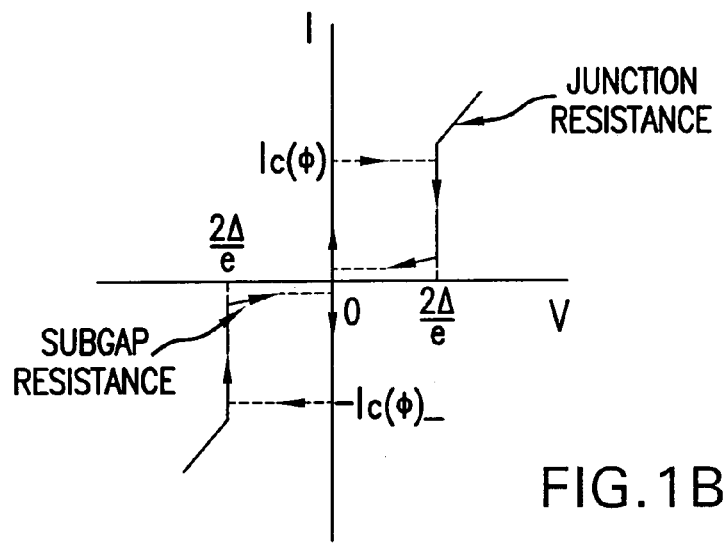
FIG. 1B is the I–V graph of the hysteretic SQUID.
Figure 1C:
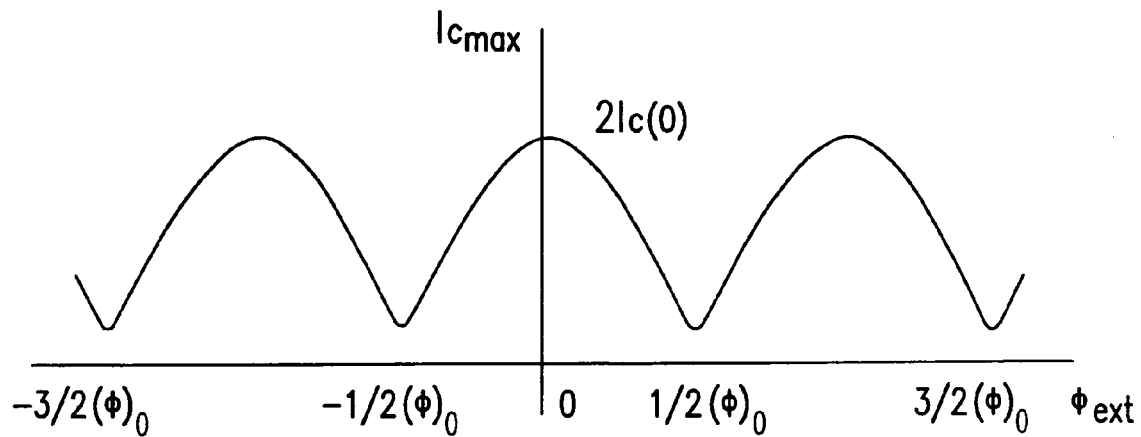
FIG. 1C is a graph of the critical current $I_C$ vs. the flux $\Phi_{ext}$ applied to the hysteretic SQUID of FIG. 1A.

As shown in FIG. 1C, the Ic ($\Phi$) changes with the external flux $\Phi$ ext applied to the SQUID loop. The hysteretic SQUID 10 has a current voltage characteristic shown in FIG. 1B, resembling that of a single Josephson junction, with the exception that the critical current Ic may be changed by applying a magnetic flux $\Phi$ to the SQUID loop. When biased current is applied, the SQUID switches from the zero voltage to the running state whenever the bias current reaches the threshold value Ic ($\Phi$). This principle is used as an underlying principle of the present invention. Specifically, by exploiting the statistical properties of the current-voltage curve in regions where the switching from the 0 voltage state occurs, an accurate tracing of the input flux is obtained.

Figure 2:
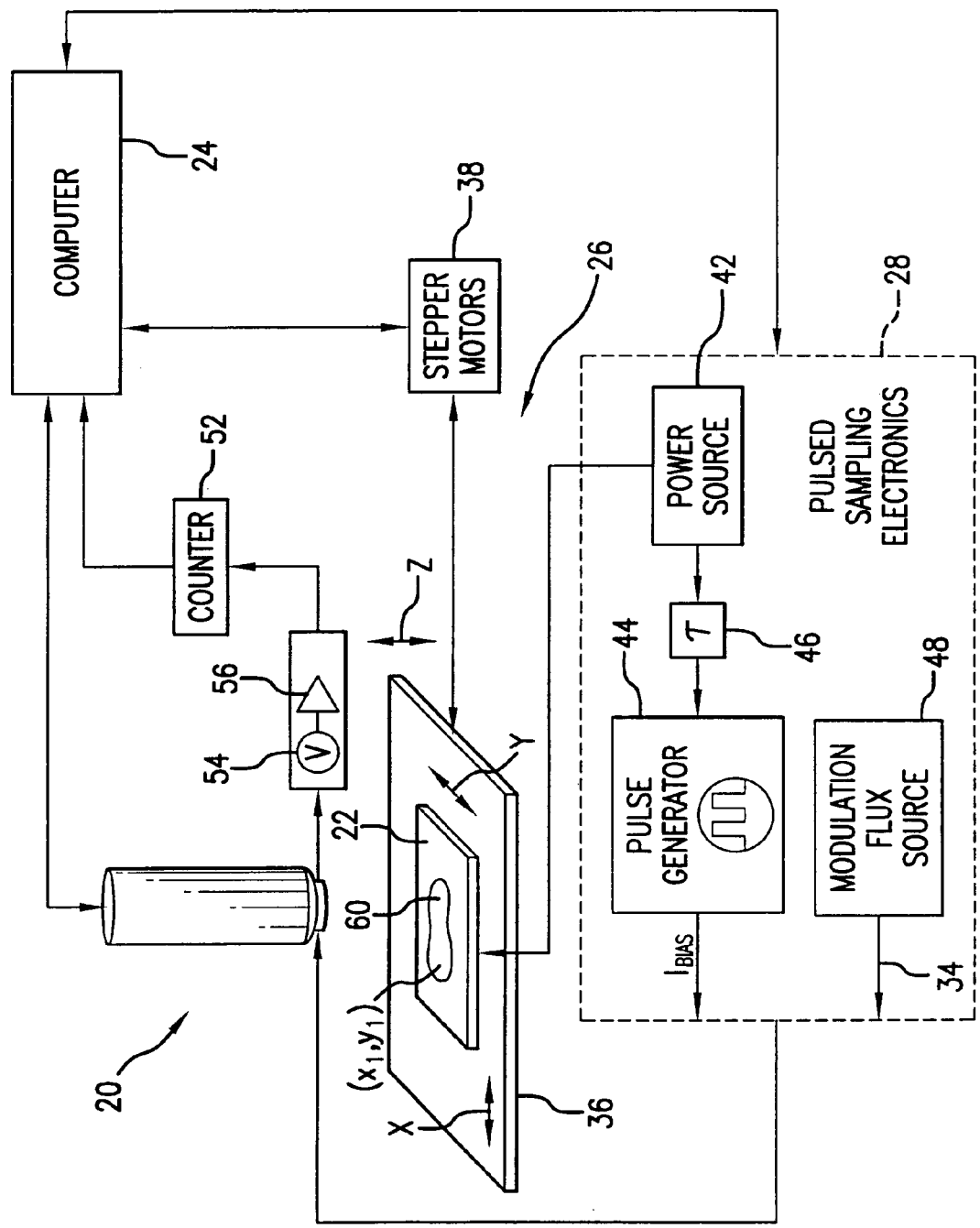
FIG. 2 is a schematic representation of the High Frequency Scanning SQUID of the present invention.

Referring to FIG. 2, showing schematically a high frequency scanning SQUID microscope system of the present invention, the system 20 is used for obtaining a map of current density distribution in a sample 22 under study. The SQUID microscope system 20 is used for acquisition of magnetic fields on or over the surface of the sample 22 generated by the current within the sample. A computer 24 is employed for processing data acquired by means of the SQUID microscope. The computer 24 additionally controls a positioning unit 26 which changes the relative disposition between the sample 22 and the SQUID 10. The computer 24 further functions to control pulsed sampling electronics 28 for high frequency measurements of magnetic fields emanating from the sample 22 under study.

Figure 3:
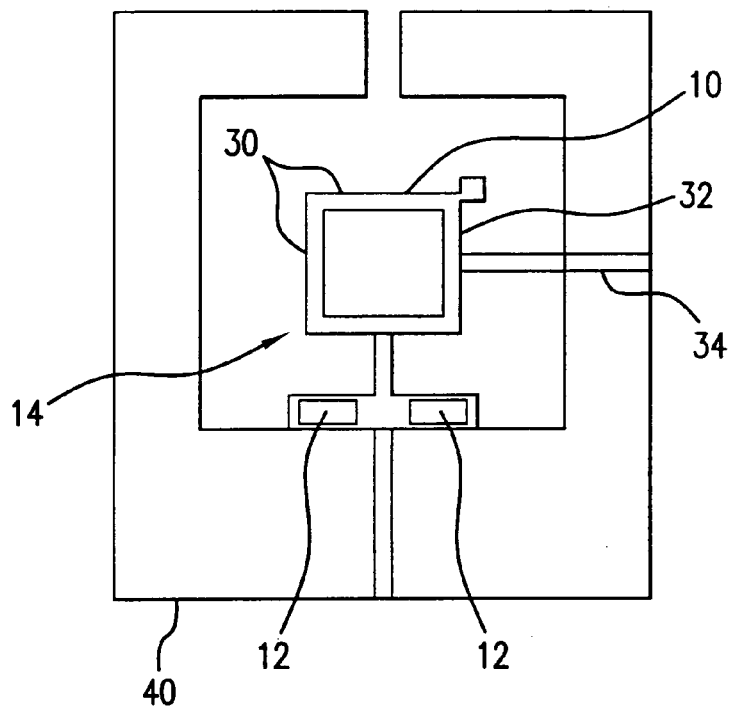
FIG. 3 is a top view of the hysteretic Nb SQUID used in the scheme of the scanning SQUID microscope of the present invention.

The scanning SQUID microscope system 20 includes the sensitive SQUID detector 10 of the magnetic fields which is a superconducting quantum interference device best presented in FIGS. 1A and 3. SQUID detector 10 is a low Tc hysteretic Nb SQUID (commercially available from Hypres, Inc.) which has a SQUID loop 14 shaped as a square with sides 30 approximately 10 μm long. The critical current Ic of the SQUID sensor 10 modulates between 55 and 87 μa. The device has a one turn feedback coil 32 for picking up the extraneous magnetic flux. However, for the measurement scheme presented in FIGS. 2 and 4, a thin copper wire is used instead of the coil 32 to serve as a flux line 34. The Josephson junctions 12 are 3 μm×3 μm in dimension, and there is no external shunt associated with each of the junctions. The SQUID detector 10 is cooled to 77° K using a commercial cryocooler, in order to obtain images with a fine resolution.

The SQUID detector 10 is brought into close proximity to the sample 22. This is made as close as possible in order to maintain the separation between the sample 22 (disposed in the ambient atmosphere) and the SQUID detector 10 (placed in the cryogenic environment) below a predetermined value. The SQUID 10 is scanned over the surface of the sample 22 to acquire a low noise image of the magnetic fields on and above the surface of the sample 22.

The sample 22 may be a microelectronic structure such as, for example, a semiconductor computer chip, multichip module, etc. Magnetic fields emanating from the sample 22, are picked up by the SQUID detector 10 as it moves relative to the sample 22 by means of the positioning mechanism 26 which includes a scanning stage 36 and stepper motors 38. The stepper motors 38 are controlled by the computer 24 to change the relative disposition between the sample 22 and the SQUID detector 10 in X, Y, and Z directions.

The output signal of the SQUID 10 is recorded by the computer 24 which additionally keeps track of the position of the sample 22. The acquired data is displayed on the screen of the computer 24 as an image of magnetic fields on and above the sample 22. The computer 24 processes the acquired data to generate a map of the current densities in the sample 22. The map (or the image) of the current flowing in the wires of the sample 22 is further compared to the CAD layout used to create the chip (or the module) 22 in order to locate a faulty region which may occur in the sample 22.

The computer 24 controls the pulse sampling electronics 28 and processes the acquired data in accordance with the principles of the present invention which is particularly developed for extending the bandwidth of the scanning SQUID microscope 20 as will be explained infra.

As shown in FIG. 3, the SQUID chip 10 is mounted on a copper ground plane 40 at the end of a dip probe. Two centimeter long wire bonds connect the common current and voltage pads to a microwave connector. Separate microwave coaxial cables for the voltage, current, and flux lines, best shown in FIG. 4 connect to a box at the top of the dip probe.

The pulsed sampling electronics block 28 includes, a power source 42 coupled to the sample 22 under study for activating the latter in order that the currents flowing in the sample 22 generate magnetic fields to be measured by the SQUID microscope 20. Further, a pulse generator 44 is included in the pulse sample electronics 28 to generate a bias current $I_{bias}$ to be supplied to the SQUID 10. The pulse generator 44 may be a Stanford Research Systems DG535 pulse generator which sends a bias current having a plurality of current pulses of a predetermined amplitude and duration. A clock unit 46 is used as a part of the pulse sample electronics 28 which sets the time delay $\tau_1$ between the activation of the sample 22 and generation of the pulsed bias current. A modulation flux source 48 provides a controlled DC modulation flux to the SQUID detector 10 in adjustable and controllable flux values range. The modulation DC flux is applied to the SQUID 10 either by means of a modulation coil or by means of a thin copper modulation wire placed alongside the SQUID 10. A Function Generator 58 may be used to supply a computer controlled DC current to the flux line 34 to create the modulated flux applied to the SQUID 10.

Figure 4:
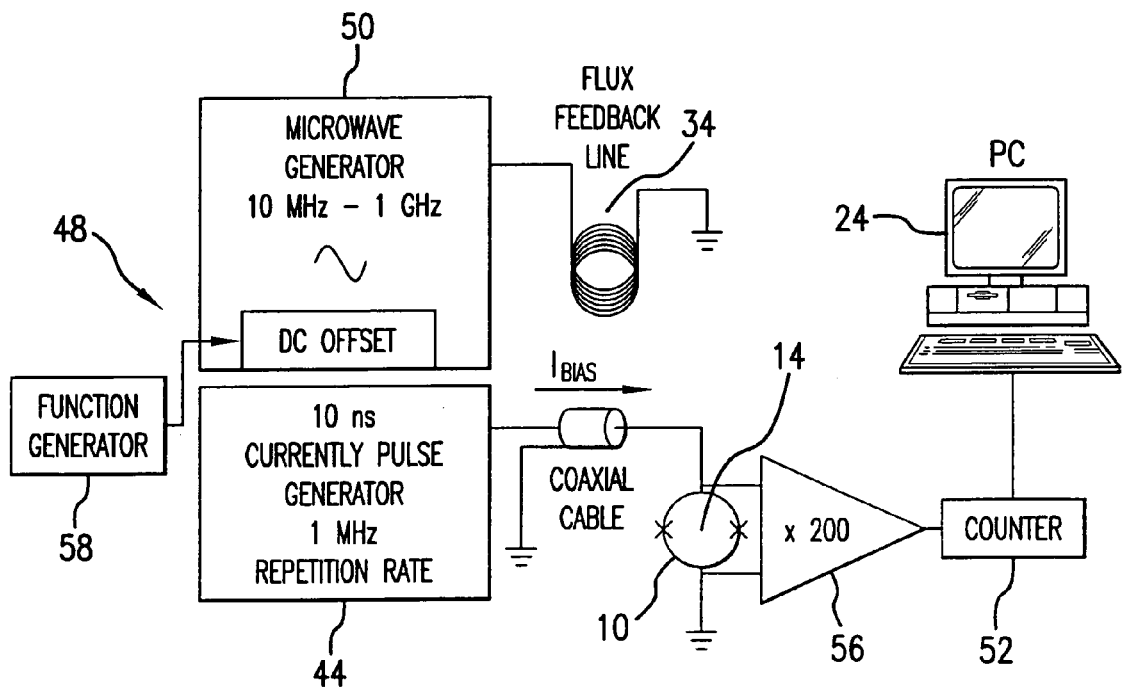
FIG. 4 is the schematic representation of the test set-up used in this invention.

Referring to FIG. 4, showing the schematics of the experimental set-up of the measuring scheme of the present invention, such includes a microwave generator 50 which generates a test signal simulating the sample under study. The signal-under-the-test is a 10 MHz–1 GHz sine wave. The microwave generator 50 is connected to the flux line 34, which, as described in previous paragraphs, may be formed as a coil or as a thin modulation wire placed in proximity to the SQUID 10. The controllable DC offset is coupled into the same line 34 of a signal-under-the-test. The controllable DC offset created by the Function Generator 58, serves as a Modulation Flux Source of FIG. 2.

The SQUID current source is a Pulse Generator 44, generating the pulsed current of a predetermined amplitude and duration. A counter 52 detects the number of switching events (voltage pulses) from the SQUID 10 in a given time interval and provides this to the computer 24 for further processing of the data.

To perform the high frequency measurement of magnetic fields emanating from the sample 22 under the study, the hysteretic SQUID 10 is positioned over a predetermined location $(x_1, y_1)$ over the sample 22. Sample 22 is activated by applying a power from the power source 42 thereto. In the test, as shown in FIG. 4, the signal-under-test generated by the microwave generator 50 serves as a simulation of the fields emanating from the sample 22.

Pulsed sampling is used for sampling the magnetic field generated by the sample 22. For performing the pulsed sampling, a pulse bias current $I_{bias}$ is applied to the SQUID 10 with a predetermined time delay τ1 with respect to the predetermined time of activation of the sample 22. The sample 22 generates a spatial and time dependent magnetic field B(x, y, z, t) which is repeated periodically at a rate corresponding to the activation signal applied to the sample 22. The bias current $I_{bias}$ is sent to the SQUID 10 as a pulse(s) of a predetermined amplitude and pulse duration.

If the flux through the SQUID 10 and the amplitude of the bias current pulse meets the appropriate criteria, a voltage pulse across the SQUID will be present and measured indicative of switching the SQUID "ON". If no voltage is measured across the SQUID, meaning that the SQUID was not triggered by application of the bias current, additional flux is sent to the SQUID via a modulation coil or flux line 34. This modulation flux is repeatedly adjusted in this manner until it is sufficient to trigger the SQUID 10. This modulation flux is then easily correlated to the magnetic field at a particular point and time $B(x_1, y_1, z, t_1)$. The entire sampling process is repeated with a new delay τ2, τ3, etc., τn, until the entire time dependent B $(x_1, y_1, z, t)$ is mapped out. This process is then repeated over the entire two-dimensional region 60 to be scanned on the sample 22 under study.

Referring once again to FIG. 4, showing the experimental set-up of the measuring scheme of the present invention where the signal under test is a simulation of the field generated by the currents flowing in the sample 22, the bias current pulse amplitude and the DC modulation flux are set such that in the absence of any signal flux (emanating from the sample), the SQUID 10 shows a voltage pulse for approximately half of the current pulses applied thereto.

Figure 5A:
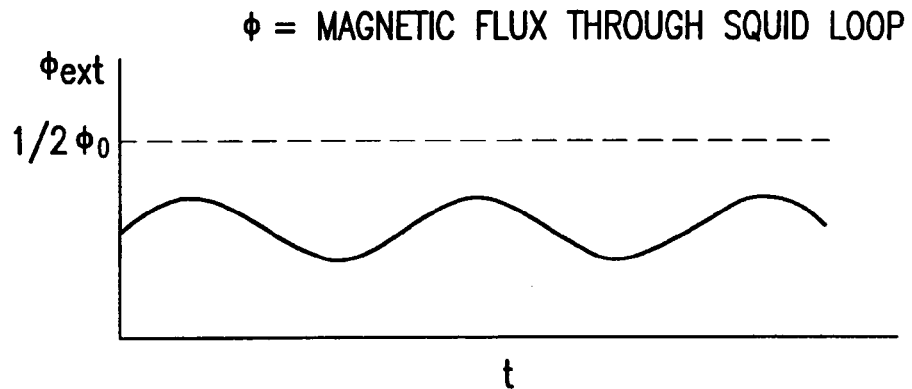
FIGS. 5A, 5B, and 5C show respectively the time diagrams of the magnetic flux $\Phi_{ext}$ through the SQUID loop, the bias current $I_{bias}$, and the output SQUID voltage $V_{SQUID}$ (which is representative of the switching event in the hysteretic SQUID)
Figure 5B:
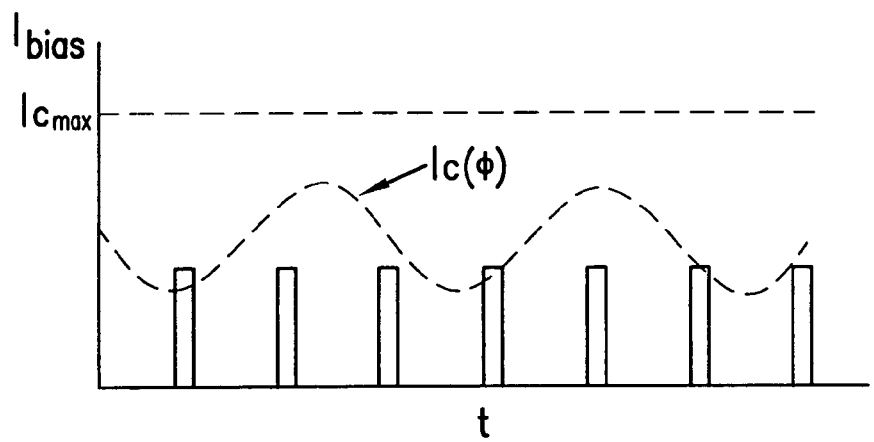
Figure 5C:
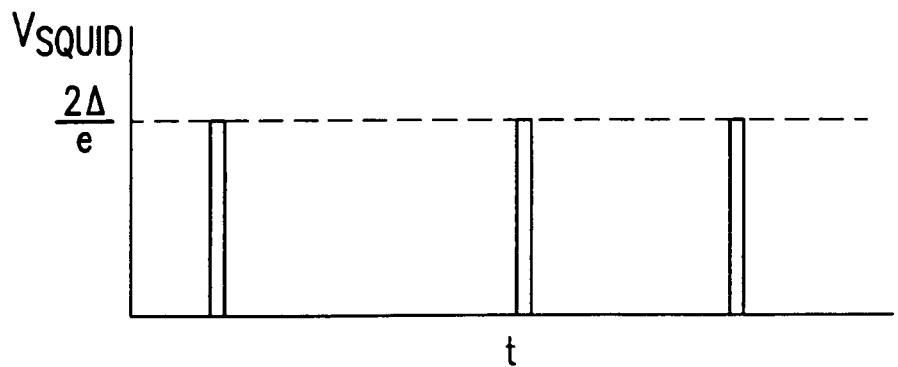
Figure 6A:
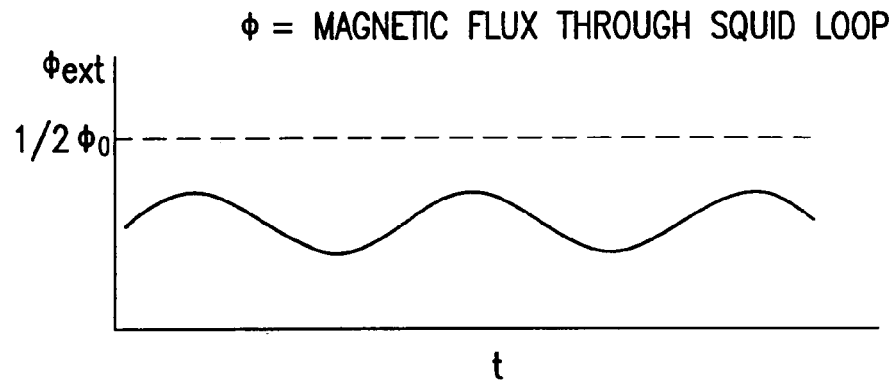
FIGS. 6A, 6B, and 6C are the time diagrams respectively of a magnetic flux $\Phi_{ext}$ through the SQUID loop, a bias current $I_{bias}$ and the current corresponding to the magnetic flux emanating from the sample, and an output SQUID voltage $V_{SQUID}$.
Figure 6B:
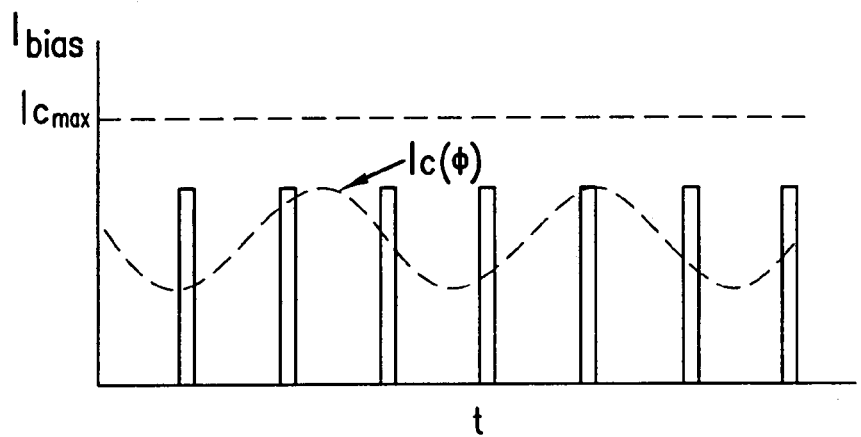
Figure 6C:
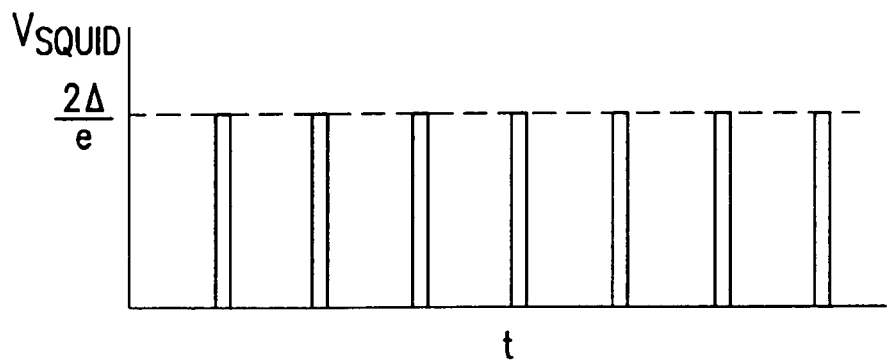

The presence of a voltage pulse $V_{SQUID}$ at the output voltage of the SQUID 10 is an indication of switching the SQUID "ON". The $V_{SQUID}$ is measured by a voltmeter 54 coupled to the output of the SQUID 10 and is amplified by an amplifier 56. The output of the amplifier is coupled to the counter 58 which may be an Agilent 53132 counter. If the bias current pulse amplitude is set too low, the SQUID will not show a voltage pulse. If, however, the $I_{bias}$ amplitude is set too high, the SQUID 10 will show continuous pulsing. As shown in FIGS. 5A–5C, if the amplitude of the pulses of the bias current are set to a small amplitude, only those bias pulses which interest the curve representing Ic (Φ), as shown in FIGS. 5A and 5B, causes a switching event in the SQUID 10, as shown in FIG. 5C. Opposingly as shown in FIGS. 6A–6C, if the amplitude of the bias current pulses is too large each bias pulse causes a generation of the voltage on the output of the SQUID, detailed in FIG. 6C.

To avoid continuous pulsing as well as failure to switch the SQUID "ON" at all, the bias current pulse amplitude is set somewhat in the mid-point of the SQUID's critical current range.

As shown in FIG. 7, representing oscilloscope traces of the bias current pulse having a duration of 10 ns, the pulse being applied to the SQUID causes the generation of $V_{SQUID}$ of approximately 2 mV. The $V_{SQUID}$ is further fed into a high frequency amplifier 56 with a gain of approximately 200 to boost the output to almost 0.5 volts. Using the Agilent 53132 counter 52, the number of voltage pulses above 0.3V threshold in a given time is counted. The time period for the sampling of magnetic fields is typically between 1 and 10 ns, which for a repetition rate of 1 MHz for the signal under test, yields maximum count from 1,000 to 10,000 events.

When the bias current is set near the midpoint of the SQUID's critical current range, the voltage pulses on the SQUID output can be turned "ON" and "OFF" by adjusting the flux at the SQUID 10. The external source of modulation flux may be simulated by using the thin copper modulation wire placed alongside the SQUID. The Function Generator 58 is used to supply a completely controlled DC current of between −50 mA to +50 mA to the flux line 34. From the periodicity of the Ic (Φ) curve shown in FIGS. 1C, 5A, 5B, 6A, 6B, and 7, it can be deduced that 82.5 mA generates 1 quantum of flux (h/2e) at the SQUID. For the 10 μm×10 μm SQUID loop 14, presented in FIG. 3, and given the 100 ohm current limiting resistor, this corresponds to transfer function of 2.5 μT/V.

In order to measure a fast time dependent flux, an oscillation test signal is sent to the flux line 34 to present the signal under test. The SQUID 10 is triggered externally by the bias current pulse. By adjusting the delay between the bias current pulse and the signal under test in the clock unit 46, shown in FIG. 2, the SQUID responds to the signal at different times.

Shown in FIGS. 8A–8D, is a representation of sampling the 100 MHz magnetic field at different time delays, particularly 0 ns, 2 ns, 3 ns, and 4 ns, respectively. To measure the test signal flux as a function of time, the amplitude of the bias current is fixed at an optimum location (in the middle of the physical current range). Then, for a given delay τ between the test signal and the bias pulse, the DC modulation flux level is swept over the predetermined range at which the SQUID switching is expected to be shown. The number of counts from the counter 52 is recorded at each flux value. Subsequently, the delay time is incremented by 1 pulse width and the DC flux is swept again over the predetermined range of values where the switching event may be expected. By repeating this process, a 2D histogram is created over the number of switching events as a function of both modulation flux and delay times τ. For each value of the delay time, the value of the flux for which the switching events occurs exactly at half (50%) of the total number of bias pulses sent may be interpolated resulting in a map of the flux from the test signal as a function of time.

Figure 9:
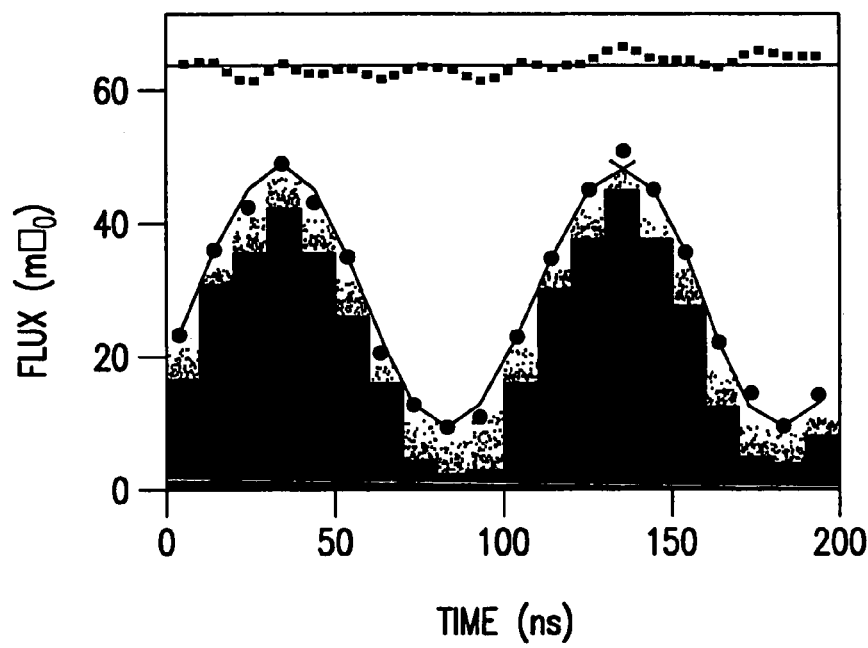
FIG. 9 represents an intensity plot showing the number of counts for each time delay (sampled every 10 ns) and flux value.

FIG. 9 illustrates such a resulting map of the flux from the test signal as a function of time. The intensity of flux shown in FIG. 9 represents the number of counts for each delay (sampled every 10 ns and a corresponding flux value). In a particular case, a 10 MHz sine wave was used as a signal. Since the sampling is done with 10 ns current pulses (bias current), the delay is set to increment in 10 ns steps, which permits sampling of the test signal 10 times per period. The intensity plot of FIG. 9 shows the number of counts for each delay and flux value. Black areas correspond to no counts and white areas correspond to the maximum number of counts ($10^4$) in this case. The solid circles mark the interpolated 50% count rate, the solid line is the best fit of a 10 MHz sine wave for this point, and the residual is shown as a dotted line.

Figure 10:
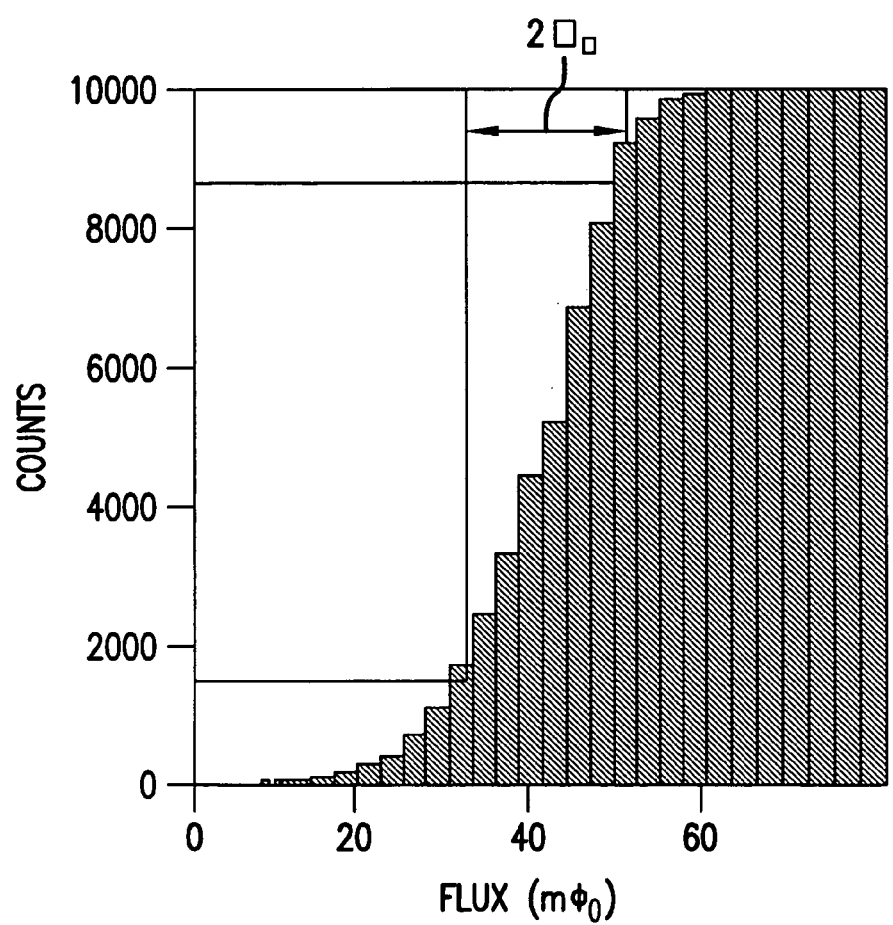
FIG. 10 is a histogram showing the line cut through the intensity of FIG. 9 at 50 ns time delay.

FIG. 10 shows a line cut through the intensity plot of FIG. 9 at a 50 ns delay time. The magnetic flux noise is estimated from the spread of this switching histogram. For a normal distribution, the single shot uncertainty is expected in the flux to be half the range between the 16% and 84% marks indicated by solid lines in FIG. 10.

Averaging over all possible delay times, an uncertainty in the flux of 7.6 m $\Phi$o was obtained. A pulse width of 10 ns corresponds to a bandwidth of 100 MHz, which indicates a white noise level of $S^{1/2}=7.6\times10^{-7}$ $\Phi_0$/Hz, where S is the power spectral density of the flux noise.

An expected S for comparison may be calculated. For a SQUID loop with inductance L at temperature T, the rms Johnson current noise obeys:

$$\frac{k_B T}{2} \approx \frac{1}{2} L \sigma_I^2 \qquad \text{(Eq. 2)}$$

Neglecting Josephson inductance, the flux noise can be approximated as $$\sigma_\Phi \approx \sqrt{k_B T L} \qquad \text{(Eq. 3)}$$

With inductance L=25 pH and T=4.2 K, $\Phi$=20 m $\Phi_0$ is then obtained. However, this is the sum of the noise level over all possible frequencies. The cut-off frequency can be defined to be the junction plasma frequency, $f_p$, given by $$f_p = \sqrt{I_o/2\pi\Phi_0 C} \qquad \text{(Eq. 4)}$$

For the SQUID 10 used, the average critical current $I_o$=45 µA is the average junction critical current, and the average junction capacitance C=0.3 pF. From Equation (4), $f_p$=100 GHz is found, and $S^{1/2}=6\times10^{-8}$ $\Phi_0$/Hz about an order of magnitude smaller than that measured.

One possible explanation for this discrepancy is that although the current pulses are nominally 10 ns long, the pulse is likely less well defined when it reaches the SQUID 10, reducing the effective pulse width. In addition, the switching may take place very soon after the current pulse is applied, in which case there is some natural switching bandwidth, which may be different from the estimated value. This bandwidth can be estimated from the measured flux noise, $\Phi$=7.6 m$\Phi_0$, and the estimated spectral noise flux density, $S^{1/2}=6\times10^{-8}$ $\Phi_0$/Hz, which yields an effective pulse width of 65 ps.

Figure 11:
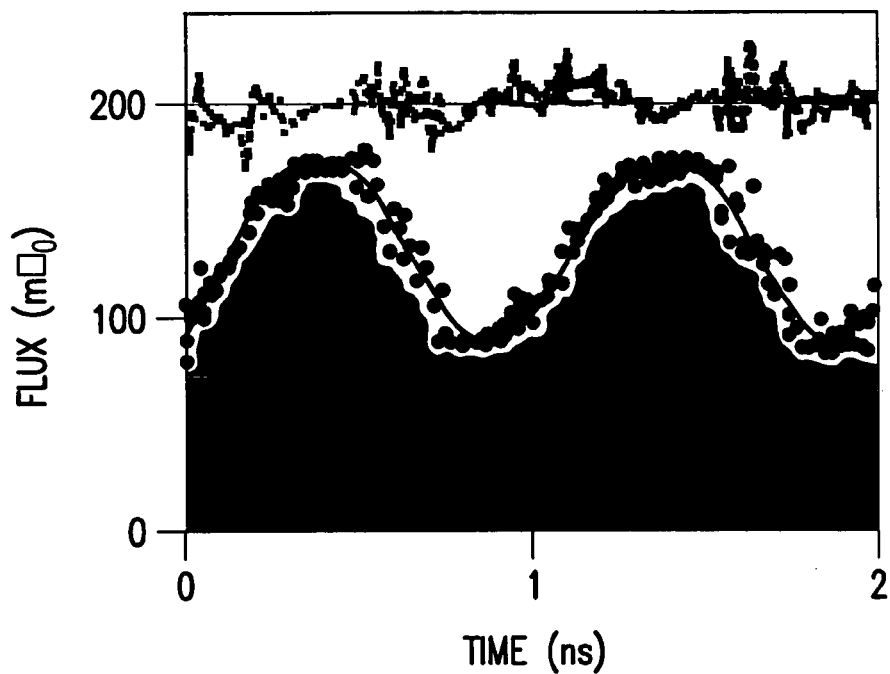
FIG. 11 is an intensity plot showing the number of counts for each time delay (sampled every 10 ps) and flux value.

To test this hypothesis, in FIG. 11 are shown the results of an experiment in which the signal-under-test is 1 GHz sine wave. Although the current pulse width remains at 10 ns, in this case the time delay with respect to the test signal is shifted by increments of only 10 ps, rather than 10 ns. If the averaging time were only 10 ns (10 periods of a 1 GHz signal), it would be expected to average over the rapidly varying signal and only a constant value would be seen. Instead, a well-defined sine wave at 1 GHz can be seen. This supports the hypothesis that the effective pulse width is considerably shorter than 10 ns, however, investigation of periodic signals other than sine waves would be necessary to confirm this.

Finally, it is noted that the residual plotted in FIG. 11 shows a somewhat higher noise level than that expected from FIG. 10. The reason for this, is that, at present, the data collection takes several minutes. Since the test was performed in an unshielded environment, a low-frequency 1/f-type drift tends to dominate the noise.

Figure 12:
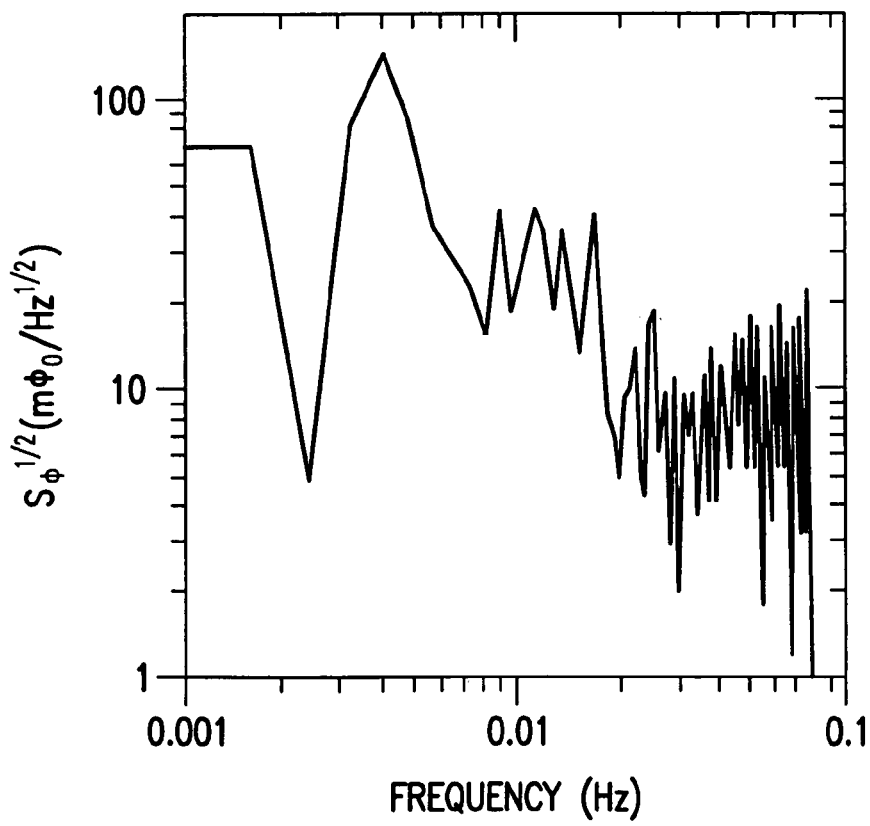
FIG. 12 is a spectral flux noise density of a scan with no test signal.

To examine the low-frequency drift, the experiment with the test signal turned off was repeated, where it was expected to only see noise. The spectral flux noise density from a 10 minute run is shown in FIG. 12, which shows that significant low-frequency noise is present. It can be anticipated that further improvements in the efficiency of the data acquisition algorithm should reduce the total scan time and permit background subtraction to eliminate the effect of such low frequency noise or interfering signals.

Figure 13:
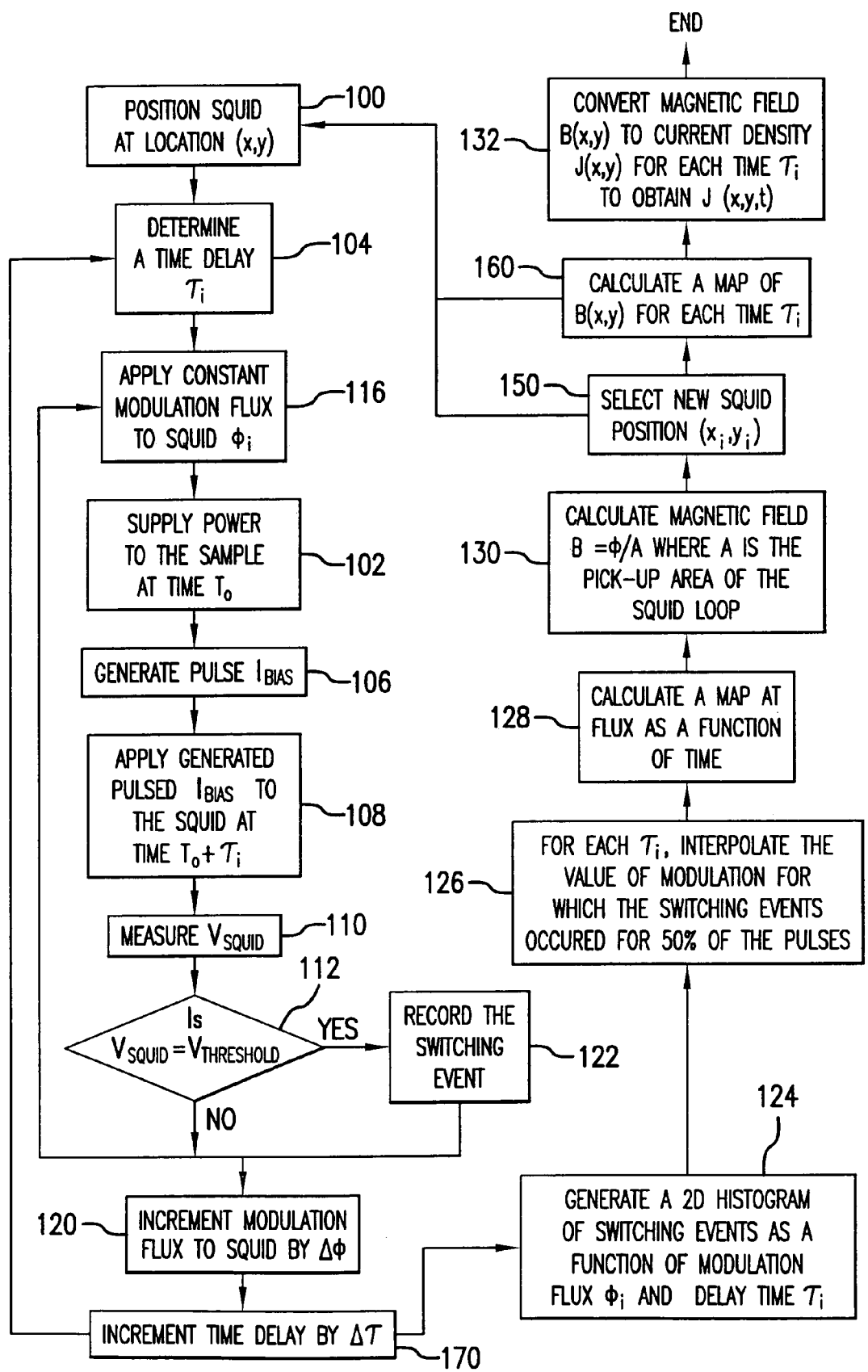
FIG. 13 is a flow-diagram representing the method of the present invention.

FIG. 13 shows a flow chart diagram of the operation of the high frequency SQUID scanning microscope of the present invention controlled by the computer 24. As shown in FIG. 13, in the box 100 "Position SQUID at Location (x, y)", the computer 24 by means of the positioning mechanism 26 positions a SQUID detector 10 over the location (x, y) as shown in FIG. 2. The flow chart further proceeds to block 104 "Determine a Time Delay $\tau_i$", in which the clock unit 46, under the control of the computer 24, determines a time delay at which the $I_{bias}$ will be coupled to the SQUID detector with regard to the time $t_0$. Flow chart further passes to box 116 "Apply Constant Modulation Flux to SQUID". The flow chart further passes to the box 102 "Supply Power to the Sample at Time $t_0$", where the power from the power source 42 is applied to the sample under study 22. Under the control of the computer 24, the sample is activated at the time $t_0$.

From block 102, the process flows to the block 106 "Generate Pulsed $I_{bias}$", in which the pulse generator 44 generates a pulsed $I_{bias}$ of the amplitude which is within the critical current range of the SQUID loop, and preferably substantially at the midpoint of the critical current range.

Further, the process flows to the block 108 "Apply Generated Pulsed $I_{bias}$ to the SQUID at time $t_0+\tau_i$", where the generated pulsed $I_{bias}$ is applied to the SQUID detector 10 with time delay $\tau_i$ relative to the $t_0$.

The flow chart proceeds further to the block 110 "Measuring $V_{SQUID}$", in which the SQUID output voltage is measured with the voltmeter 54. This $V_{SQUID}$ is an indication of the switching event of the SQUID detector 10.

From the block 110, the procedure flows to the logic block 112 "Is $V_{SQUID}>V_{threshold}$", where $V_{threshold}$ is some chosen voltage below the SQUID switching voltage and above the noise level. If this condition is false, processes in the blocks 116, 102, 106, 108, 110, 112 are repeated. If the condition is true, the switching event is recorded in block 122 "Record Switching Event" by a counter 52 (shown in FIG. 2) before repeating processes 116, 102, 106, 108, 110, 112, 122.

The process flows further to the block 120 "Increase the Modulation Flux to SQUID by $\Delta\phi$", in which under the control of the computer 24, the modulation flux source 48 couples an additional DC modulation flux to the SQUID detector. From block 120 through the block 170 "Increment the Time Delay by Δτ", the procedure returns to block 104 to repeat the process as in blocks 116–120 for different time delays $\tau_i$.

The computer 24 further uses the recorded switching events in block 122 to generate a 2D histogram shown in FIG. 9 of the number of switching events as a function of the modulation flux values (for which the switching event occurred) and a plurality of time delays $\tau_i$, as shown in block 124.

After creating the 2D histogram, shown in FIG. 9, in block 124, the flow chart proceeds to the block 126, where for each $\tau_i$, the value of the modulation flux for which the switching event occurred for half of the pulses applied to the SQUID, is interpolated. Further, using the interpolation graph shown in FIG. 11, and calculated in the block 126, a map of the flux generated by the sample under study as a function of time is calculated in block 128. Using the calculated map in block 128, the computer 24 processes such a map in block 130 and calculates the magnetic field B emanating from the sample 22 as B=Φ/A, where Φ is a modulation flux, and A is the pick-up area of the SQUID loop.

Further, the procedure flows to block 150 where a new SQUID position $(x_i, y_i)$ is selected. The processes in blocks 100–130 and 150 are repeated until all positions (x, y) have been mapped out; and the procedure follows to block 160 in which a map of B(x,y) is calculated for each delay time $\tau_i$.

Finally, the procedure flows from the block 130, 150 and 160 to the block 132 where the calculated magnetic field B is converted into the current image of the current flowing in the sample 22. To convert the magnetic field image into an image of currents flowing in the sample, the standard magnetic inverse is performed which involves taking a forward Fast Fourier Transformer (FFT) multiplying the result of the forward FFT by the appropriate exponential factor (the Biot-Savart factor), and then performing an inverse FFT.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of the elements may be reversed or interposed, all without departing from the spirit or scope of the invention as defined in the appended claims.

What is claimed is:

1. A method of measurement of high-frequency magnetic fields with a Superconducting Quantum Interference Device (SQUID), the method comprising the steps of:
   positioning a hysteretic SQUID over a predetermined location over a sample under study;
   activating at a predetermined time, the sample under study to generate a magnetic field emanating therefrom; and
   pulsed sampling said magnetic field by the steps of:
   (a) applying a pulsed bias current to said hysteretic SQUID after a predetermined time delay with respect to said predetermined time, said pulsed bias current comprising at least one pulse of a predetermined amplitude,
   (b) coupling a modulation flux to said hysteretic SQUID, and sweeping said modulation flux over a predetermined flux range sufficient to trigger said SQUID, thereby resulting in generation of at least one SQUID switching event at a respective modulation flux value,
   (c) recording said at least one SQUID switching event, and
   (d) repeating said steps (a)–(c) for a plurality of time delays; and
   interpolating said respective modulation flux values to obtain a corresponding value of said magnetic field emanating from the sample under study as a function of time.

2. The method of claim 1, wherein said hysteretic SQUID has a critical current range, further comprising the step of:
   presetting said predetermined amplitude of said at least one pulse within said critical current range.

3. The method of claim 2, further comprising the step of:
   presetting said predetermined amplitude of said at least one pulse substantially at the mid-point of said critical current range.

4. The method of claim 1, wherein said modulation flux is a DC flux.

5. The method of claim 1, further comprising the step of:
   subsequent to step (d) of said pulsed sampling, generating a two-dimensional histogram of the recorded switching events as a function of said respective modulation flux values and said plurality of time delays.

6. The method of claim 1, further comprising the steps of:
   scanning said hysteretic SQUID over a two-dimensional region on the sample under study, and
   pulsed sampling said magnetic field by performing said steps (a)–(d) at each location of said region.

7. The method of claim 1, comprising the step of:
   measuring an output voltage of said hysteretic SQUID as an indication of said switching event.

8. The method of claim 1, wherein said at least one pulse has a predetermined pulse width, further comprising the step of:
   in said step (d), incrementing said time delays substantially by said pulse width duration.

9. The method of claim 5, further comprising the step of:
   for a respective value of each of said plurality of time delays, interpolating said respective modulation flux values to obtain a map of a magnetic flux emanating from the sample under study as a function of time.

10. High-Frequency Superconducting Quantum Interference Device (SQUID) Scanning Microscope, comprising:
    a hysteretic SQUID sensor;
    a scanning unit operatively coupled to said hysteretic SQUID sensor to change a relative disposition between the SQUID sensor and an object under study;
    a power source coupled to the object under study to activate the latter at a predetermined time, to generate a magnetic field emanating therefrom;
    a pulsed sampling unit, comprising:
      a pulse generator coupled to said hysteretic SQUID sensor to supply thereto a pulsed bias current, said pulsed bias current including at least one pulse of a predetermined amplitude,
      a clock circuit coupled to said pulse generator to apply said at least one pulse to said hysteretic SQUID sensor with a predetermined time delay relative to said predetermined time, and
      a modulation flux source magnetically coupled to said hysteretic SQUID sensor to feed thereto a magnetic modulation flux in a predetermined value range sufficient to trigger said hysteretic SQUID, thereby resulting in generation of at least one SQUID switching event at a respective modulation flux value;

a counter acquiring and recording switching events of said hysteretic SQUID sensor; and a processor interpolating for each said time delay, said respective modulation flux values to obtain a corresponding thereto value of the magnetic field emanating from the sample under study.

11. The high-frequency SQUID microscope of claim 10, wherein said hysteretic SQUID sensor is a low-$T_c$ SQUID.

12. The high-frequency SQUID microscope of claim 10, wherein said hysteretic SQUID sensor includes a SQUID loop characterized by a predetermined critical current range, further comprising a current controlling circuit presetting said predetermined pulse amplitude within said critical current range.

13. The high-frequency SQUID microscope of claim 12, further comprising a modulation coil magnetically coupled to said SQUID loop to feed said modulation flux thereto.

14. The high-frequency SQUID microscope of claim 12, further comprising a flux line magnetically coupled to said SQUID loop to feed said modulation flux thereto.

15. The high-frequency SQUID microscope of claim 10, further comprising a voltmeter coupled to an output of said hysteretic SQUID sensor, a voltage measured by said voltmeter being an indication of said at least one SQUID switching event.

16. The high-frequency SQUID microscope of claim 10, wherein said processor generates a two-dimensional histogram of a number of the SQUID switching events as a function of said modulation flux values and said time delay.

17. The high-frequency SQUID microscope of claim 10, wherein said processor interpolates, for each time delay, said modulation flux values corresponding to said SQUID switching events to create a map of a magnetic flux emanating from the object under study as a function of time.

* * * * *